(12) United States Patent
Yoshida

(10) Patent No.: US 6,566,642 B1
(45) Date of Patent: May 20, 2003

(54) IMAGE RECORDING APPARATUS AND IMAGE RECORDING METHOD

(75) Inventor: Futoshi Yoshida, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 84 days.

(21) Appl. No.: 09/678,832

(22) Filed: Oct. 4, 2000

(30) Foreign Application Priority Data

Oct. 4, 1999 (JP) .............................. 11-283343

(51) Int. Cl.$^7$ .............................................. H01L 27/00
(52) U.S. Cl. .............................. 250/208.1; 250/559.29; 250/559.3; 250/559.37
(58) Field of Search .................... 250/559.29, 559.3, 250/559.33, 559.37, 208.1; 369/43, 44.11, 44.12, 44.26, 44.31, 44.34; 358/468, 474, 475, 497

(56) References Cited

U.S. PATENT DOCUMENTS

| | | | | |
|---|---|---|---|---|
| 5,319,187 A | * | 6/1994 | Ammann | 250/203.3 |
| 5,787,315 A | * | 7/1998 | Tanaka et al. | 360/1 |
| 5,923,404 A | * | 7/1999 | Yoshida | 355/27 |
| 6,097,197 A | * | 8/2000 | Matsuyama et al. | 250/306 |

* cited by examiner

Primary Examiner—Robert H. Kim
Assistant Examiner—Courtney Thomas
(74) Attorney, Agent, or Firm—Sughrue Mion, PLLC

(57) ABSTRACT

In an image recording apparatus which records an image on a recording medium by moving (subscanning) the recording medium while the recording medium is scanned (main scanning) with a scanner, a feed amount of the photosensitive material is detected by a detector and, on the basis of the detected result, a variation amount of movement speed is computed at a controller. A motor, which drives a light source unit in a main scanning direction is adjusted in accordance with the variation amount. Thus, a subscanning direction scanning line pitch error is corrected.

22 Claims, 17 Drawing Sheets

USUALLY USED
REFLECTING SURFACE

UPSTREAM REFLECTING
SURFACE

DOWNSTREAM REFLECTING
SURFACE

IMAGE RECORDING APPARATUS AND IMAGE RECORDING METHOD

BACKGROUND OF THE INVENTION

1. Field of the Invention

The present invention relates to an image recording apparatus which records an image on a recording medium by moving (subscanning) the recording medium while scanning (main scanning) with a scanner, and to an image recording method.

2. Description of the Related Art

In an image recording apparatus which records an image by carrying out main scanning on a recording medium with a light beam or a writing head while moving (subscanning) the recording medium in a direction substantially perpendicular to a main scanning direction, it is important to decrease a subscanning direction scanning line pitch error, in order to decrease image unevenness.

Conventionally, the subscanning direction scanning line pitch error has been decreased by improving the mechanical accuracy of components of a driving system which moves the recording medium in the subscanning direction, such as a motor or the like.

Alternatively, a feed amount of the recording medium was detected by a detector such as an encoder or the like. On the basis of detection results, the feed amount of the recording medium was feedback-controlled so as to correct the subscanning direction scanning line pitch.

However, in the above-described scanning line pitch correction methods, mechanical accuracy was improved, resulting in higher costs.

Also, in order for a driving means such as a motor or the like, which moves the recording medium, to be able to operate with maximum accuracy by controlling the feed amount of the recording medium so as to be constant, the feed amount of the recording medium was varied by feedback control, which increased the number of error factors. As a result, accuracy tended to decrease.

SUMMARY OF THE INVENTION

The present invention was devised in order to solve the above-described problems, and an object of the present invention is to provide an inexpensive image recording apparatus which can correct a subscanning direction scanning line pitch with high accuracy.

According to a first aspect of the invention, an image recording apparatus comprises a scanner which records an image by scanning lines formed by scanning on a recording medium in a predetermined scanning direction; a detector which detects an amount of feed of the recording medium which is fed in a direction substantially perpendicular to the scanning direction of the scanner; and a controller which controls an image recording position of the scanner in a direction of feeding the recording medium in accordance with the feed amount detected by the detector.

According to a second aspect of the invention, an image recording apparatus comprises a scanner which has a light emitting portion and records an image by scanning on a recording medium with a light beam emitted from the light emitting portion in a predetermined scanning direction; a detector which detects a feed amount of the recording medium fed in a direction substantially perpendicular to the scanning direction of the scanner; and a controller which, in accordance with the feed amount detected by the detector, controls an incident angle with respect to the recording medium when a light beam of the scanner irradiates the recording medium.

According to a third aspect of the invention, an image recording method which records an image by scanning a recording medium which is fed in a direction substantially perpendicular to a scanning direction of a scanner comprises the steps of detecting a feed amount of the recording medium; computing a feed error from the feed amount; and correcting an image recording start time of the scanner on the basis of the feed error.

DESCRIPTION OF THE PREFERRED EMBODIMENTS

An example of embodiments of the present invention will be described in detail hereinafter with reference to the drawings.

First Embodiment
Overall Structure of Apparatus (Exterior of Apparatus)

Figure 1:
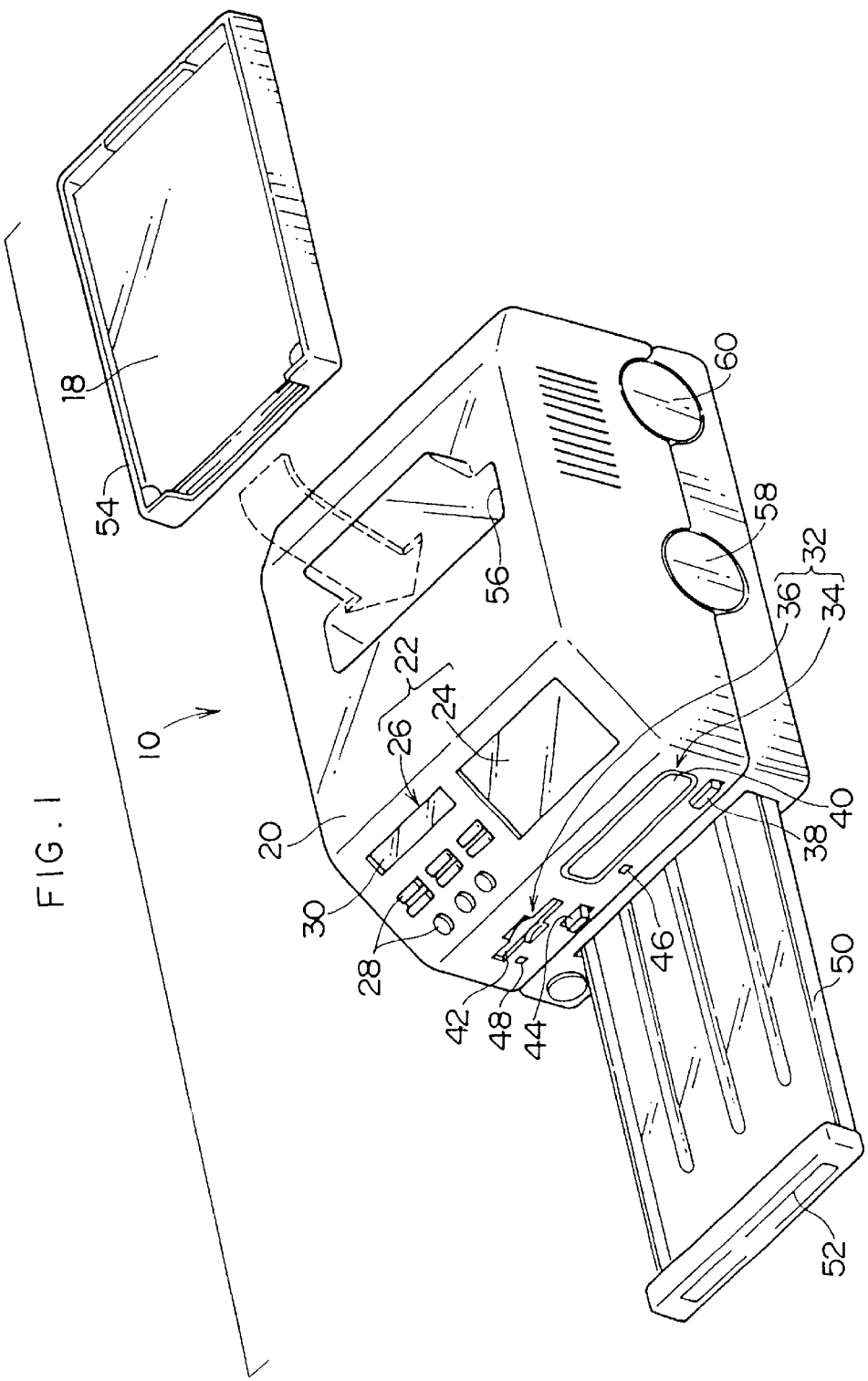
FIG. 1 is a perspective view showing an exterior of an image recording apparatus relating to embodiments of the present invention.
Figure 2:
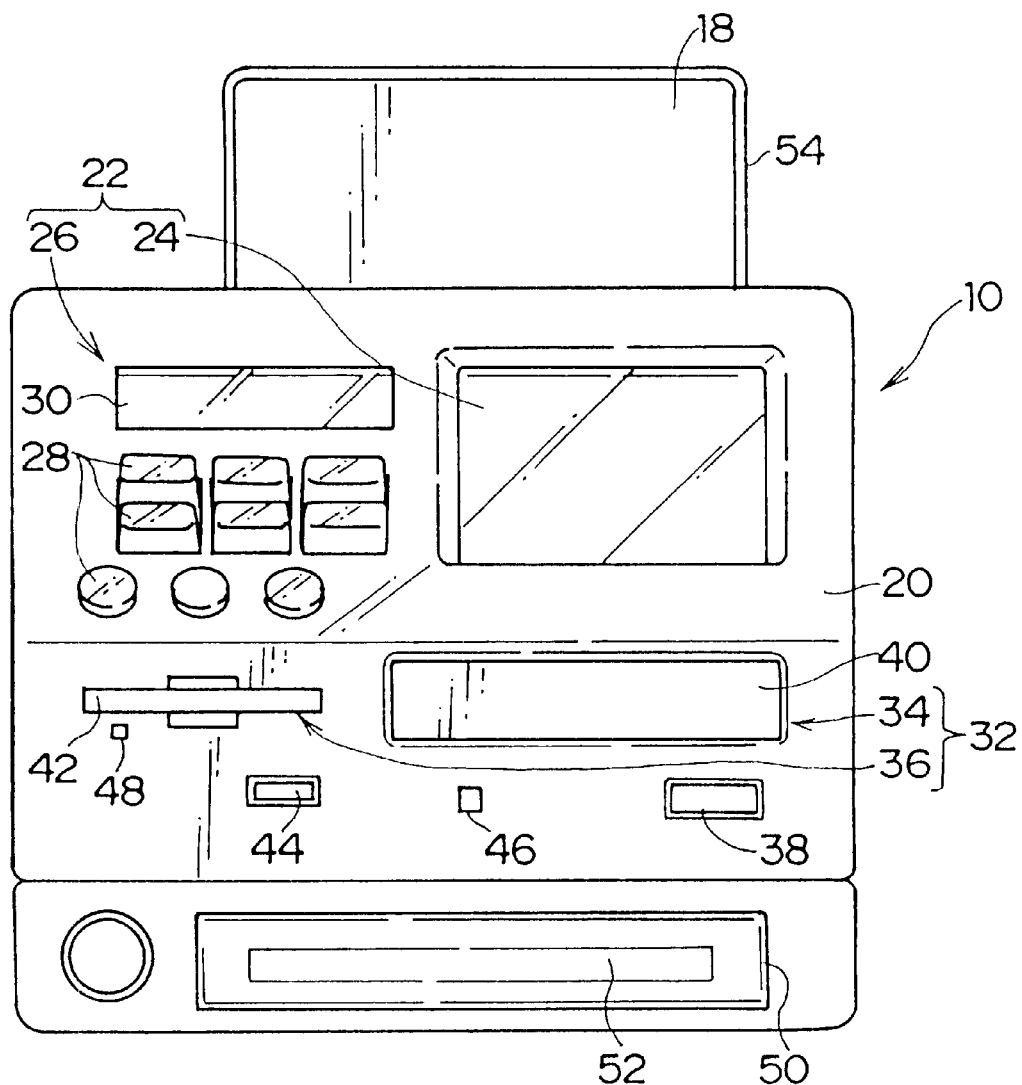
FIG. 2 is a front view of the image recording apparatus relating to the embodiments of the present invention.
Figure 3:
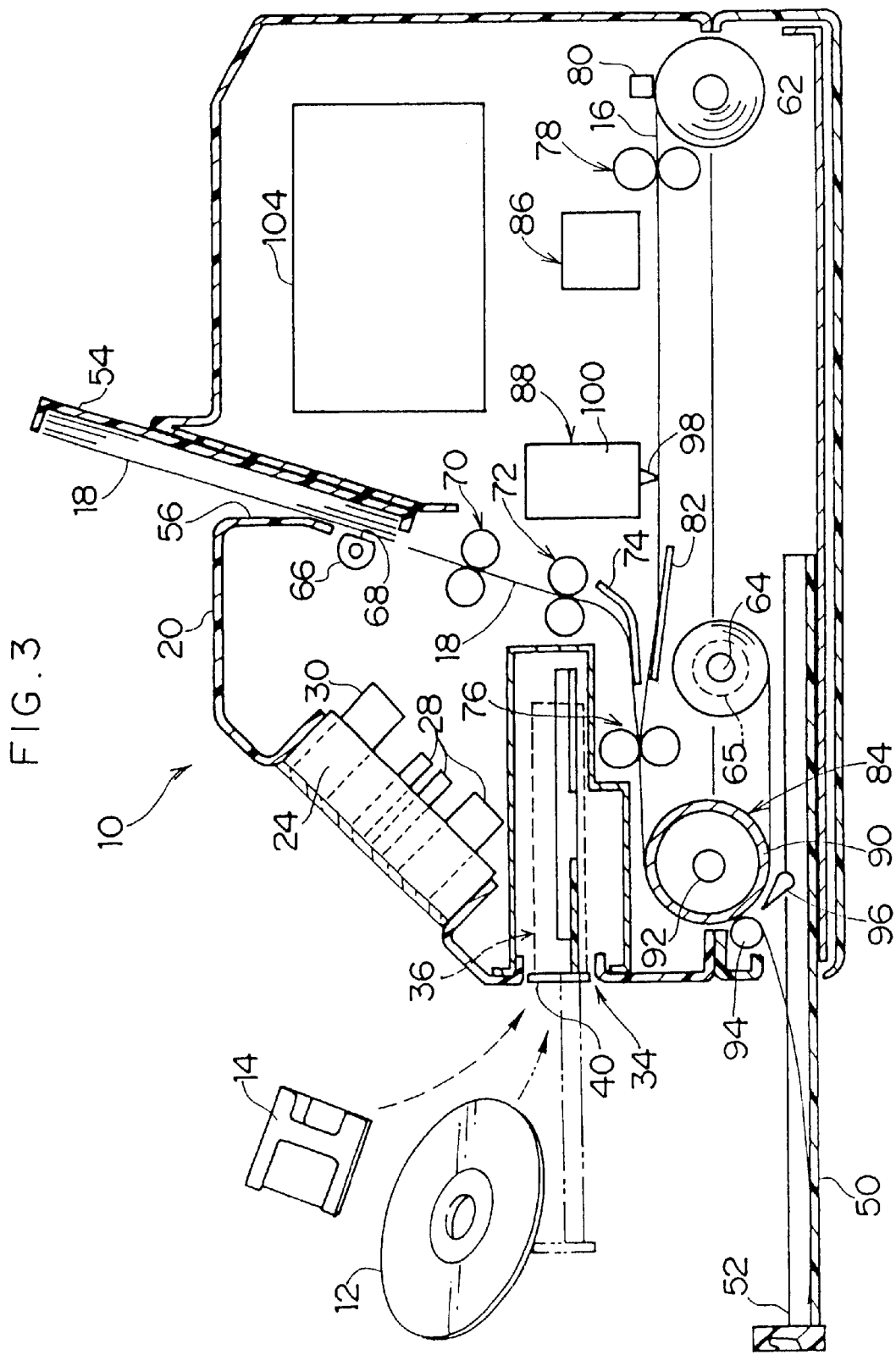
FIG. 3 is a side cross-sectional view showing an internal structure of the image recording apparatus relating to the embodiments of the present invention.

FIGS. 1 through 3 show an image recording apparatus 10 relating to the present embodiments. As shown in FIG. 3, the image recording apparatus 10 is an apparatus which reads image data recorded on a CD-ROM 12 or an FD (a floppy disk) 14, carries out exposure by irradiating light based on the image data onto a photosensitive material 16 which is a recording medium of the present invention, transfers the image recorded on the photosensitive material 16 onto ordinary paper (image receiving paper 18) and outputs the paper.

As shown in FIG. 1, an upper portion of a front surface of a box-shaped casing 20 of the image recording apparatus 10 is formed as an inclined surface, and an operation/display portion 22 is provided thereat.

As shown in FIG. 2, the operation/display portion 22 is divided into a monitor portion 24 and an input portion 26. The monitor portion 24 displays an image based on the image data which has been read in the above-described manner.

The input portion 26 is formed by a plurality of operation keys 28 and an input data confirming display portion 30. Data which is necessary for image recording, such as a number of sheets to be recorded, size setting, color balance adjustment, negative/positive choice and the like can be inputted at the input portion 26.

A deck portion 32 is disposed below the operation/display portion 22. The deck portion 32 is formed by a CD-ROM 12 deck portion 34 and an FD deck portion 36, as shown in FIG. 2.

At the CD-ROM deck portion 34, a tray 40 can be opened or closed by pressing an opening/closing button 38. The CD-ROM 12 is placed on the tray 40 and thus the CD-ROM 12 can be loaded into the interior of the apparatus.

The FD deck portion 36 is provided with an FD insertion slot 42. When the FD 14 is inserted into the FD insertion slot 42, a driving system within the apparatus operates so as to take the FD 14 inside. When the FD 14 is to be taken out, the FD 14 is ejected from the FD insertion slot 42 when an operation button 44 is pressed.

The CD-ROM deck portion 34 and the FD deck portion 36 are provided with access lamps 46 and 48, respectively. A corresponding access lamp turns on during access of the CD-ROM deck portion 34 or of the FD deck portion 36.

An output tray 50 is positioned further below the deck portion 32. The output tray 50 is usually accommodated within the apparatus, and can be taken out by handling a grip portion 52 (see FIG. 1).

Image receiving paper 18 onto which an image has been recorded is delivered to the output tray 50.

The image receiving paper 18 is accommodated in advance as a stack in a tray 54. The tray 54 is loaded into a tray loading opening 56 provided at a top surface of the casing 20. The image receiving paper 18 is taken, sheet-by-sheet, from the tray 54 which is loaded into the tray loading opening 56. After an image has been transferred to the image receiving paper 18, the image receiving paper 18 is guided to the output tray 50.

Two circular cover members 58 and 60 are mounted at the casing 20 (toward the front with respect to the page surface of FIG. 1). The cover members 58 and 60 are separately detachable. As shown in FIG. 3, a supply reel 62, around which photosensitive material 16 is wound, and a take-up reel 64 are disposed within the apparatus along the axial directions of the cover members 58 and 60. These reels can be removed from or loaded into the apparatus when the cover members 58 and 60 are removed.

Image Receiving Paper Conveying System

As shown in FIG. 3, the tray 54 which is loaded into the tray loading opening 56 faces a D-shape roller 66 at a distal end portion top surface of the tray 54.

The D-shaped roller 66 is formed such that a portion of the circumferential surface thereof is cut away to form a surface which is parallel to an axis of the D-shaped roller 66. A cutout portion 68 of the D-shaped roller 66 faces the uppermost image receiving paper 18 in the tray 54 with a predetermined distance therebetween. When the D-shaped roller 66 rotates, the circumferential surface of the D-shaped roller 66 contacts the uppermost image receiving paper 18. The image receiving paper 18 is drawn out a little by one rotation of the D-shaped roller 66. The drawn out image receiving paper 18 is nipped by a first roller pair 70. Then, by driving force of the first roller pair 70, the image receiving paper 18 is completely drawn out from the tray 54.

A second roller pair 72, a guide plate 74 and a third roller pair 76 are disposed in that order at the downstream side of the first roller pair 70. The image receiving paper 18 is nipped by the first roller pair 70, then nipped by the second roller pair 72, guided by the guide plate 74 and nipped by the third roller pair 76.

At the third roller pair 76, the image receiving paper 18 is superposed with the photosensitive material 16. That is, the third roller pair 76 is also used as a conveying member for the photosensitive material 16.

Photosensitive Material Conveying System

The photosensitive material 16 is loaded into the apparatus as an elongated band which is wound onto the supply reel 62 in a layered manner. The cover member 60 is removed (see. FIG. 1) and the supply reel 62 is inserted in the axial direction. As a result, the supply reel 62 can be loaded into a predetermined position.

A procedure for loading the photosensitive material 16 is as follows. Firstly, the outermost layer of the photosensitive material 16 is drawn from the supply reel 62. Then, the photosensitive material 16 is nipped by a fourth roller pair 78, which is disposed in the vicinity of the loading position of the supply reel 62 passes a guide plate 82 and is nipped by the third roller pair 76. Finally, the photosensitive material 16 wraps about a heat roller 84 and then wraps around the take-up reel 64. In this case, a leader tape having a length necessary for loading may be provided at a distal end portion of the photosensitive material 16.

An exposure section 86 is disposed on the conveying path of the photosensitive material 16 between the fourth roller pair 78 and the guide plate 82. A water applying section 88 is provided between the exposure section 86 and the guide plate 82. An image is exposed onto the photosensitive material 16 in the exposure section 86. Then, with water applied to an emulsion surface (exposed surface) of the photosensitive material 16, the photosensitive material 16 is superposed with the image receiving paper 18 by the third roller pair 76. Details of the exposure section 86 and the water applying section 88 will be described later.

A feed amount detector 80, which detects a feed amount of the photosensitive material 16 that is being conveyed from the supply reel 62 to the exposure section 86, is provided near the supply reel 62. Feed amount results detected for the photosensitive material 16 by the feed amount detector 80 are outputted to a controller 104 of the exposure section 86, which will be described later. The photosensitive material 16 is conveyed toward the exposure section 86 by a motor 65 provided at the take-up roller 64. For example, a rotary encoder may be used as the feed amount detector 80. Heat Roller The heat roller 84 is a heat development transfer section of the image recording apparatus of the present invention. The heat roller 84 is formed by a cylindrical roller main body 90 and a heater 92 which is provided within the roller main body 90 along an axis thereof. A surface of the roller main body 90 is heated by application of electricity to the heater 92, and the surface applies heat to members wound onto the roller main body 90 (the photosensitive material 16 and the image receiving paper 18). An image recorded on the photosensitive material 16 is transferred to the image receiving paper 18 by this heating.

A peeling roller 94 and a peeling pawl 96 are provided in a vicinity of the lower side of the heat roller 84. The peeling roller 94 and the peeling pawl 96 guide the image receiving paper 18, which is wrapped about approximately one third of the circumferential length of the heat roller 84.

On the other hand, the photosensitive material 16 is wound about approximately half of the circumferential length of the heat roller 84. Thus, the photosensitive material 16 is turned through 180° and guided to the position where the take-up reel 64 is loaded.
Water Applying Section As shown in FIG. 3, the water applying section 88 is formed by an elongated applying piece 98 which stretches along the widthwise direction of the photosensitive material 16, and a tank 100 which stores water. At the water applying section 88, water, which serves as a solvent for image formation, is applied to the photosensitive material 16 or the image receiving paper 18. Then superposed surfaces of the photosensitive material 16 and the image receiving paper 18 are close contacted with each other and heat development is carried out.

The applying piece 98 is made of a material having a high liquid absorbency, such as felt, sponge or the like, and has an appropriate hardness. An appropriate amount of water is continuously supplied from the tank 100 to the applying piece 98 using capillarity. The photosensitive material 16 contacts the applying piece 98. Thus, water is applied to the top surface (emulsion surface) of the photosensitive material 16 by the applying piece 98.

Because the applying piece 98 abuts the photosensitive material 16 with an appropriate pressure, water can be applied to the photosensitive material 16 uniformly.

In the first embodiment, water within the tank 100 is refilled by removing the whole water applying section 88. Water may however be continuouly supplied from the outside of the apparatus by provision of piping.

Figure 4:
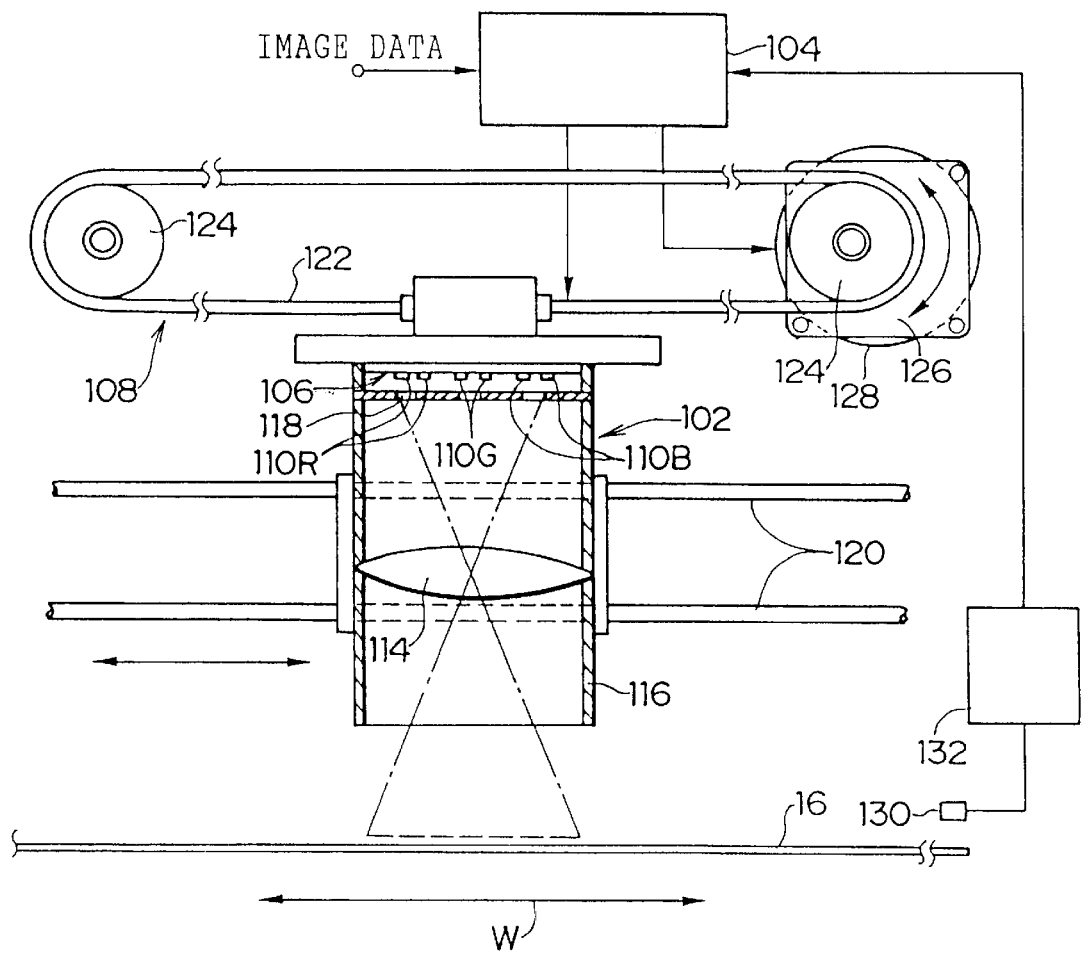
FIG. 4 is a front view showing a schematic structure of an exposure section relating to a first embodiment of the present invention.

In the first embodiment, water is used as the solvent for image formation. This water is not limited to pure water, and generally available water may be used. The solvent for image formation may be a mixture of water and a low-boiling-point solvent such as methanol, DMF, acetone, diisobutyl ketone or the like. Further, the solvent for image formation may be a solution which includes an image formation accelerator, an antifoggant, a development stop agent, a hydrophilic heat solvent and the like.
Exposure Section FIG. 4 shows the exposure section 86 relating to the first embodiment. The exposure section 86 includes a light source unit (shuttle head) 102, which is a main component provided above the conveying path of the photosensitive material 16, and is connected to the controller 104. As described above, image data obtained by reading from a CD-ROM, an FD or the like is inputted to the controller 104. A full-color image formation light source portion 106 within the light source unit 102 is turned on in accordance with the image data. Details of the controller 104 will be described later.

The light source unit 102 can be moved in the widthwise direction of the photosensitive material 16 (the main scanning direction) by being driven by a main scanning unit 108 which will be described later. Main scanning is carried out while the photosensitive material 16 passes the exposure section 86.

The light source unit 102 of the exposure section 86 includes a box-shaped exposure casing 116 and a full-color image formation light source portion 106, which is disposed on an upper end surface of the exposure casing 116. Apertures 118 are disposed below the light emitting surface of the full-color image formation light source portion 106, to restrict spreading of R, G and B light emitted from an R-LED chip 110R, a G-LED chip 110G and a B-LED chip 110B respectively.

A lens 114 is disposed below the apertures 118 at a central portion of the exposure casing 116. The lens 114 collects light from the full-color image formation light source portion 106 and focuses the light in a vicinity of the photosensitive material 16. The resolution of the focussed light is about 300 to 400 dpi. Although the lens 114 is shown as a single lens in FIG. 4, a lens system in which a plurality of lenses is combined may be used.

The lens 114 is formed by a plurality of lenses and a diaphragm so as to form a lens system in which magnification does not vary even if the height of an imaging surface changes to some extent, small errors caused by movements of the light source unit 102 in the vertical direction can be absorbed thereby.

Image focusing is continuously adjusted by an automatic focusing mechanism (not shown in the drawings) so as to be optimum.

The light source unit 102 is supported by a pair of guide shafts 120 which are parallel to each other and which form a portion of the main scanning unit 108. The guide shafts 120 are disposed along a widthwise direction of the photosensitive material 16 (the direction of arrow W in FIG. 4). The light source unit 102 is guided by the guide shafts 120 to be movable in the widthwise direction of the photosensitive material 16.

The photosensitive material 16 has non-image areas at widthwise direction end portions thereof. When the light source unit 102 scans one scanning line, it moves over one non-image area, an image area and another non-image area of the photosensitive material 16, in that order.

A portion of an endless timing belt 122 is fixed to the exposure casing 116 of the light source unit 102. Main scanning direction end portions of the timing belt 122 are wrapped about sprockets 124 which are respectively disposed in vicinities of ends of the guide shafts 120. A rotation shaft of one of the sprockets 124 is connected to a rotation shaft of a stepping motor 128 via a transmission 126. The stepping motor 128 rotates reciprocatingly and moves the full-color image formation light source portion 106 back and forth along the guide shafts 120.

Driving of the stepping motor 128 is controlled by the controller 104. When the photosensitive material 16 is passing the exposure section 86, the stepping motor 128 starts rotating such that the light source unit 102 moves above the photosensitive material 16 along the widthwise direction thereof. When a predetermined signal has been detected, the stepping motor 128 rotates in reverse and the light source unit 102 is returned to its original position thereby.

A photodiode 130 is disposed in the vicinity of a main scan start position between the light source unit 102 and the photosensitive material 16. The photodiode outputs an analog signal whose magnitude is proportional to an amount of light from the full-color image formation light source portion 106. The photodiode 130 is connected to a light amount correction unit 132, and the analog signal is inputted to the light amount correction unit 132.

In the light amount correction unit 132, detected light amounts from the LED chips 110R, 110G and 110B are compared, and correction data for adjusting light amounts and color balance is outputted to the controller 104. On the basis of the correction data, image data to be sent to the full-color image formation light source portion 106 is corrected, and the respective LED chips 110R, 110G and 110B are turned on for appropriate amounts of light.

Controller

Figure 5:
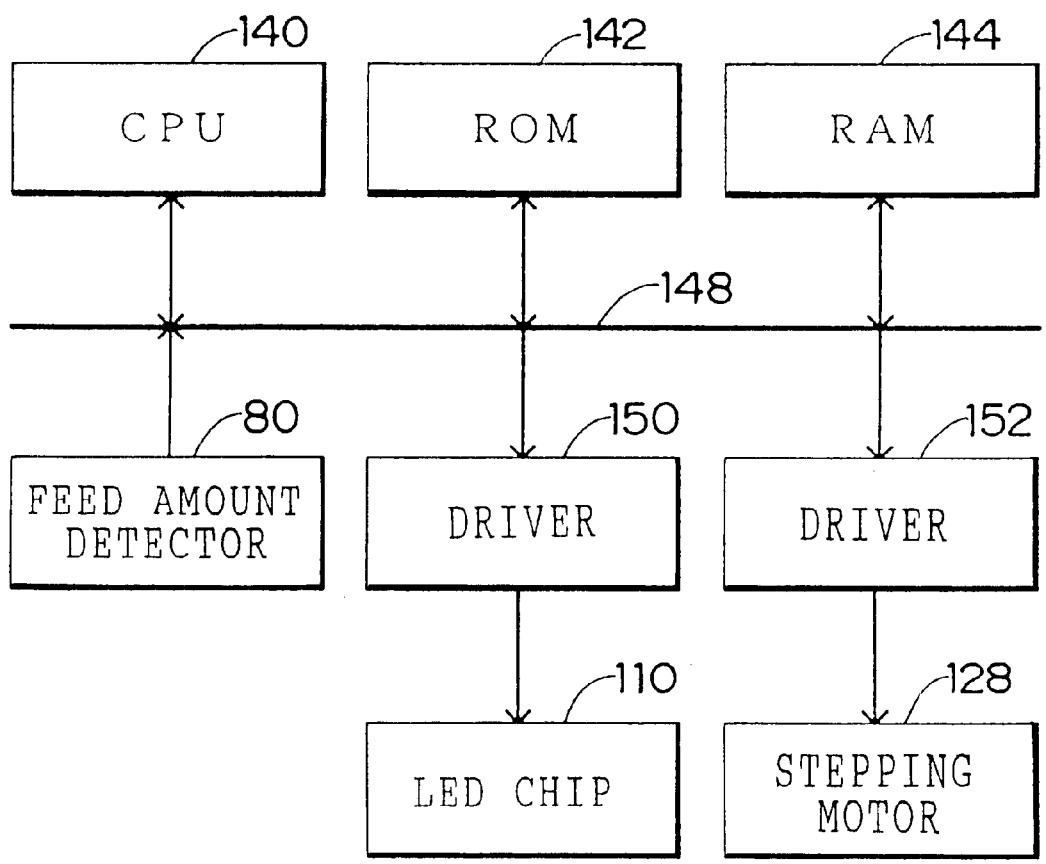
FIG. 5 is a block diagram showing a structure of a control system including a controller relating to the first embodiment of the present invention.

As shown in FIG. 5, the controller 104 is formed by a microcomputer which includes a CPU 140, a ROM 142 and a RAM 144. The CPU 140, the ROM 142 and the RAM 144 are respectively connected to a data bus 148.

Also connected to the data bus 148 are a driver 150, which causes the LED chips 110R, 110G and 110B to emit light, a driver 152 which drives the stepping motor 128 that moves the above-described light source unit 102, and the above-described feed amount detector 80, which detects the feed amount of the photosensitive material 16.

Feed amounts of the photosensitive material 16 in a predetermined period of time, which are detected by the feed amount detector 80, are stored in the RAM 144 and are erased from the RAM 144 after being read out.

The CPU 140 computes an amount of variation between the feed speed of the photosensitive material 16 and the feed amount stored in the RAM 144. In accordance with the amount of variation, a movement speed of the light source unit 102 is adjusted while the light source unit 102 is moving over the non-image areas.

Next, a description will be given of a method of correcting a line scanning pitch in the subscanning direction, with reference to a chart in FIG. 6.

For scanning line pitch correction in the subscanning direction, firstly, a subscanning accumulated feed amount y is measured by the feed amount detector 80 (step 210). The subscanning accumulated feed amount y is a feed amount in an accumulation period that has been determined in advance on the basis of previously measured error variation patterns. Measurement of the subscanning accumulated feed amount y starts as close as possible to a main scan start time at which the next main scan will start, making allowance for the amount of time required for calculations.

Then a subscanning feed amount Y for correcting the main scan start time is estimated (step 212). The subscanning feed amount Y is estimated by carrying out an estimation computation based on variation tendencies (trends) of the subscanning accumulated feed amount y, using a least squares approximation or the like.

Next, a subscanning accumulated feeding error ΔY is computed (step 214). The computation is carried out using the following formula (i).

$$\Delta Y = Y - \text{Target Feed Amount} \qquad \text{(i)}$$

In formula (i), the target feed amount is a feed amount which is preset for the apparatus; i.e., a feed amount in a case in which there are no variations in accuracy of components that form a mechanism for conveying the photosensitive material.

Then, a main scan start time correction amount ΔT is computed (step 216). This computation is carried out using the following formula (ii).

$$\Delta T = \Delta Y / Vy \quad (Vy: \text{Target Feed Speed}) \qquad \text{(ii)}$$

In formula (ii), the target feed speed is a target feed amount per unit time.

Error correction is carried out on a standard main scan start time (main scan start position) using the main scan start time correction amount ΔT, which has been computed as described above, using one of the following methods (step 218).

(1) If a waiting time at a start point and/or an end point of movement of the light source unit 102 is to be corrected, the correction amount is computed using the following formula (iii) and added to the waiting time.

$$\text{Correction Amount of Main Scan Waiting Time } \Delta Ts = -\Delta T \qquad \text{(iii)}$$

(2) If a position of the start point and/or the end point of movement of the light source unit 102 (a stop position) is to be corrected, a correction amount for a main scan stop position ΔX is computed using the following formula (iv). (If the stop position is to be moved in the main scanning direction, ΔX has a positive value.)

$$\Delta X = \Delta T \times Vx/2 \text{ (Vx: Main Scanning Speed) (Constant Speed Region))} \qquad \text{(iv)}$$

In formula (iv), it is assumed that a distance for acceleration/deceleration of the light source unit 102 is constant, while a constant speed distance is increased/decreased in accordance with the width of the photosensitive material 16 being used.

(3) If the main scanning speed of the light source unit 102 at the non-image areas is to be corrected, an acceleration/deceleration pattern (acceleration/deceleration time setting) is adjusted on the basis of a main scan waiting time correction amount AT computed using the formula (ii), or an acceleration/deceleration pattern is selected from a table of acceleration/deceleration patterns that was created and stored in advance. The acceleration/deceleration pattern to be used must be determined before the main scanning acceleration/deceleration starts.

Operation of the image recording apparatus 10 of the present invention in a case of using the above-described correction method (3) will now be explained with reference to a flowchart in FIG. 7.

The tray 54 is loaded into the tray loading opening 56. The supply reel 62 on which the photosensitive material 16 is wound and the empty take-up reel 64 are loaded into their respective predetermined positions. After loading of the photosensitive material 16 has been completed, a print start key of the operation/display portion 22 is operated. In step 160, conveyance of the photosensitive material 16 starts.

Then, in step 162, the feed amount of the photosensitive material 16 is detected by the feed amount detector 80, and a detection result is stored in the RAM 144 of the controller 104.

As described above, the photosensitive material 16 is desirably conveyed at a target feed speed. In actuality, however, the feed amount of the photosensitive material 16 varies due to eccentricities of the supply reel 62 and the take-up reel 64, and due to variations in accuracy of the motor 65 that drives the take-up reel 64, and the like. Then, in step 164, a variation of the feed amount (i.e., a variation of the conveying speed) is computed by the CPU 140 of the controller 104 from results of detection by the feed amount detector 80, and a determination is made as to whether or not the feed amount has varied.

If the determination in step 164 is affirmative, i.e., if it is determined that the feed amount of the photosensitive material 16 has varied, the process proceeds to step 166.

In step 166, movement adjustment of the light source unit 102 (details of which will be described later) is carried out in accordance with the variation of the feed amount of the photosensitive material 16, and the subscanning direction scanning line pitch error is corrected.

Figure 7:
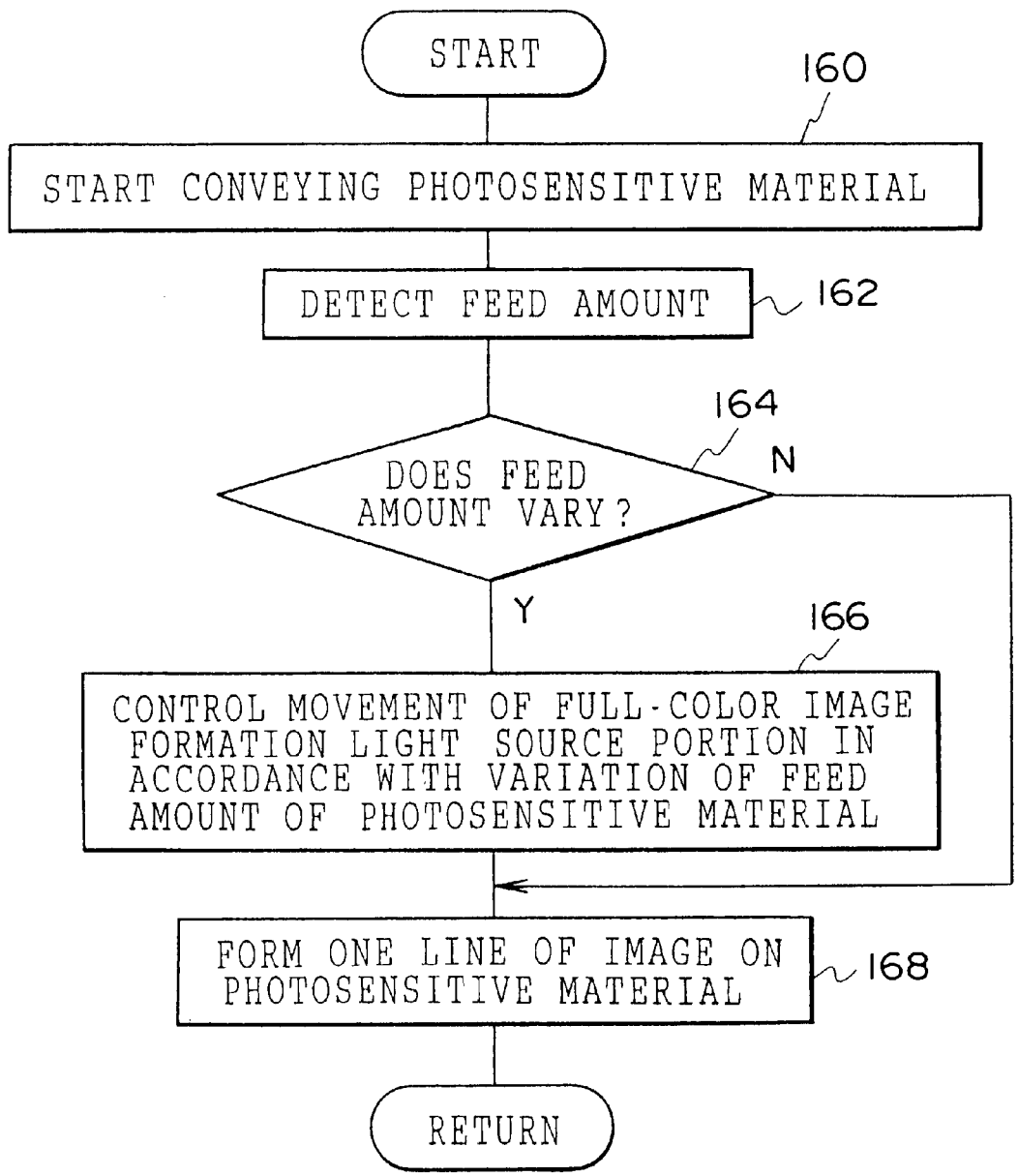
FIG. 7 is a flowchart for explaining operation of an image recording apparatus relating to the first embodiment of the present invention.

In step 168, one line of an image is recorded onto the photosensitive material 16 in accordance with the movement of the light source unit 102, which movement was adjusted in step 166, and the process of FIG. 7 returns to the beginning.

On the other hand, if the determination in step 164 is negative, i.e., if it is determined that there has been no significant variation of the feed amount of the photosensitive material 16 and that the photosensitive material 16 is being conveyed at a substantially constant speed, the process proceeds to step 168. In step 168, one line of the image is recorded onto the photosensitive material 16, and the process of FIG. 7 returns to the beginning.

Next, movement control of the light source unit 102 in step 166 will be explained.

Figure 8:
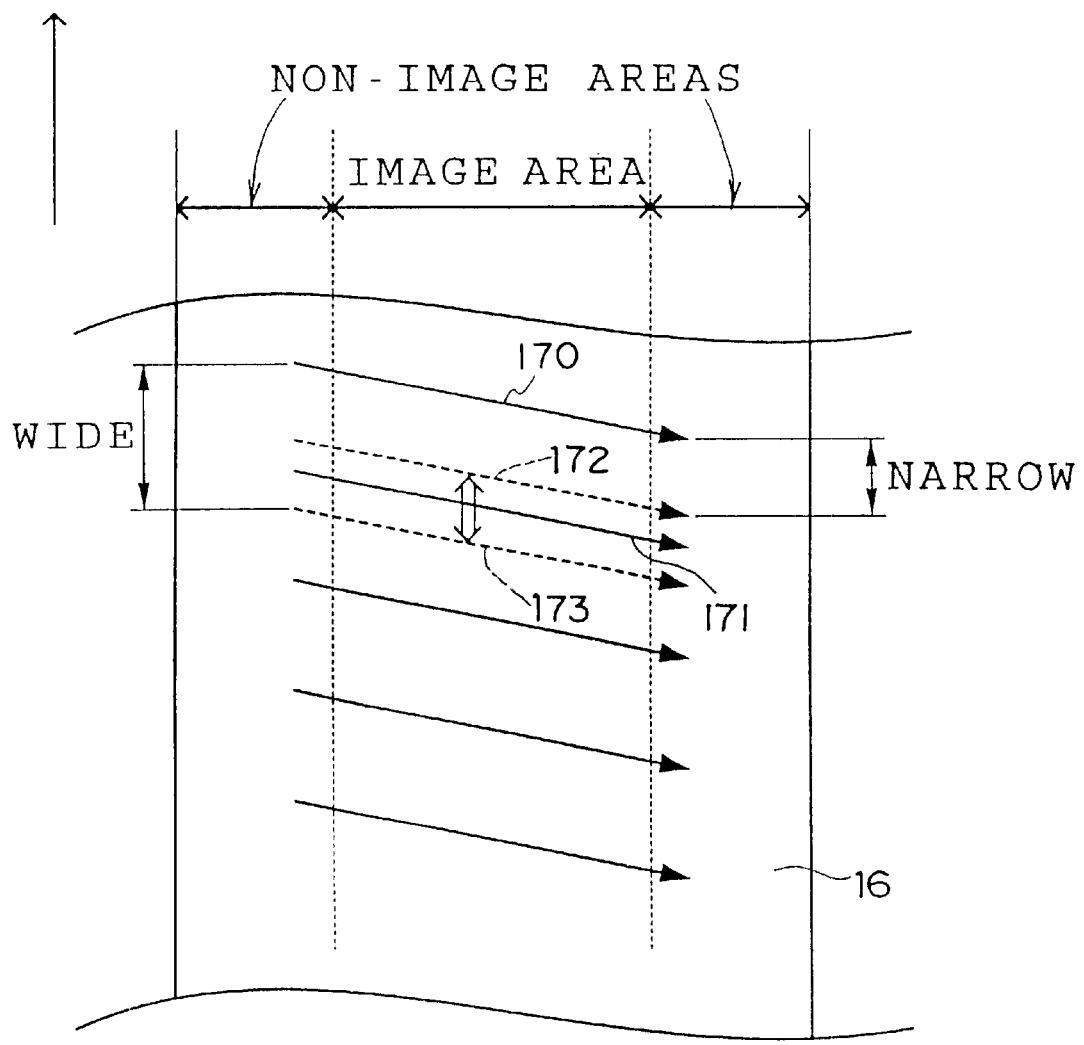
FIG. 8 is a view for explaining subscanning direction scanning line pitch correction in the image recording apparatus relating to the first embodiment of the present invention.

As shown in FIG. 8, if the photosensitive material 16 is moving at the target feed speed, a next scanning line after a scanning line 170 will be at a target scanning line 171.

However, if the movement speed of the photosensitive material 16 is slower than the target feed speed, the next scanning line will be at a dotted line 172, which is shifted to the scanning line 170 side of the target scanning line 171. Thus, scanning line pitch will be narrowed, resulting in image unevenness. The scanning line pitch can be corrected so as to be constant by making the movement speed of the light source unit 102 when the light source unit 102 is moving over the non-image areas slower.

Further, if the movement speed of the photosensitive material 16 is faster than the target feed speed, the next scanning line will be at a dotted line 173 which is shifted to a side of the target scanning line 171 opposite the scanning line 170 side thereof. Thus, the scanning line pitch will be widened, resulting in image unevenness. The scanning line pitch can be corrected so as to be constant by making the movement speed of the light source unit 102 when the light source unit 102 is moving over the non-image areas faster.

In this way, the subscanning direction scanning line pitch can be corrected by adjusting the speed at which the light source unit 102 moves over the non-image areas, The present embodiment is structured such that, of the forward and backward movements of the light source unit 102, image recording by the full-color image formation light source portion 106 of the light source unit 102 is carried out only during the forward movements. However, image recording may be carried out only during the backward movements of the light source unit 102, or may be carried out during both the forward movements and the backward movements.

In addition to the above-described correction methods (1) to (3), it is also possible to correct the subscanning direction scanning line pitch error by adjusting irradiation timings of light outputted from the LED chips 110R, 110G and 110B of the full-color image formation light source portion 106.

As shown in FIG. 8, in a case in which, on the basis of the detection result from the feed amount detector 80, it is anticipated that the next scanning line will be at the scanning line 172, which is shown by a dotted line and is shifted to the scanning line 170 side of the target scanning line 171, and that the scanning line pitch will thus be narrowed, the scanning line pitch can be corrected so as to be constant by delaying the timing for irradiating light outputted from the full-color image formation light source portion 106.

Further, in a case in which, on the basis of the detection result from the feed amount detector 80, it is anticipated that the next scanning line will be at the scanning line 173, which is shown by a dotted line and is shifted to the side of the target scanning line 171 opposite the scanning line 170 side thereof, and that the scanning pitch will thus be widened, the scanning line pitch can be corrected so as to be constant by advancing the timing for irradiating light outputted from the full-color image formation light source portion 106.

Figure 9B:
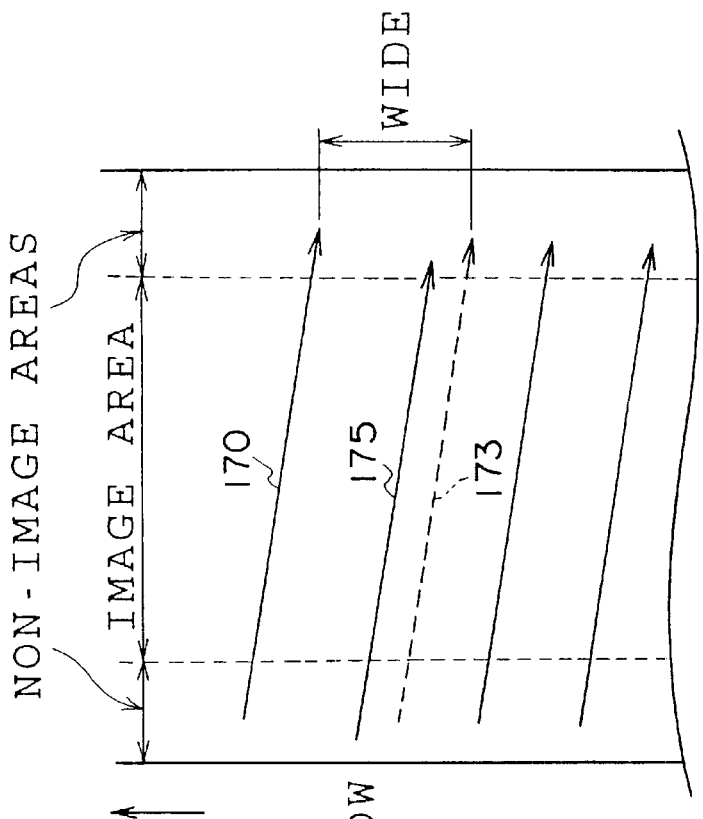
FIG. 9B is a view for explaining the other method of correcting the subscanning direction scanning line pitch in the image recording apparatus relating to the first embodiment of the present invention.
Figure 9A:
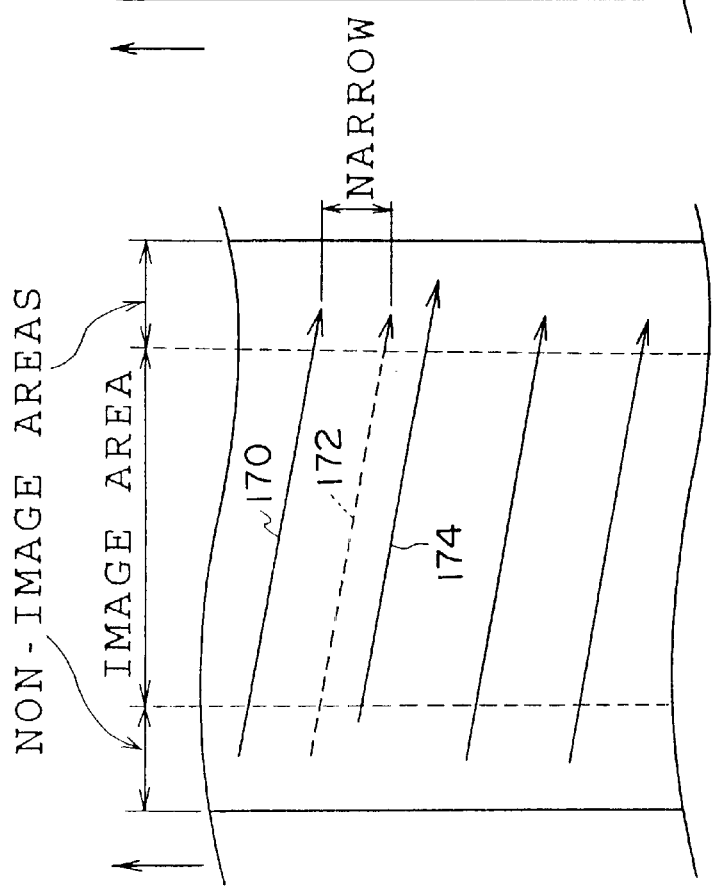
FIG. 9A is a view for explaining another method of correcting the subscanning direction scanning line pitch in the image recording apparatus relating to the first embodiment of the present invention.

Here, when the timing for irradiating light outputted from the full-color image formation light source portion 106 is adjusted, corrected scanning lines 174 and 175 are shifted along the main scanning direction as shown in FIGS. 9A and 9B. Accordingly, image positions are also shifted in the main scanning direction. Thus, a timing for writing an image area with light outputted from the full-color image formation light source portion 106 needs to be corrected simultaneously.

Figure 13:
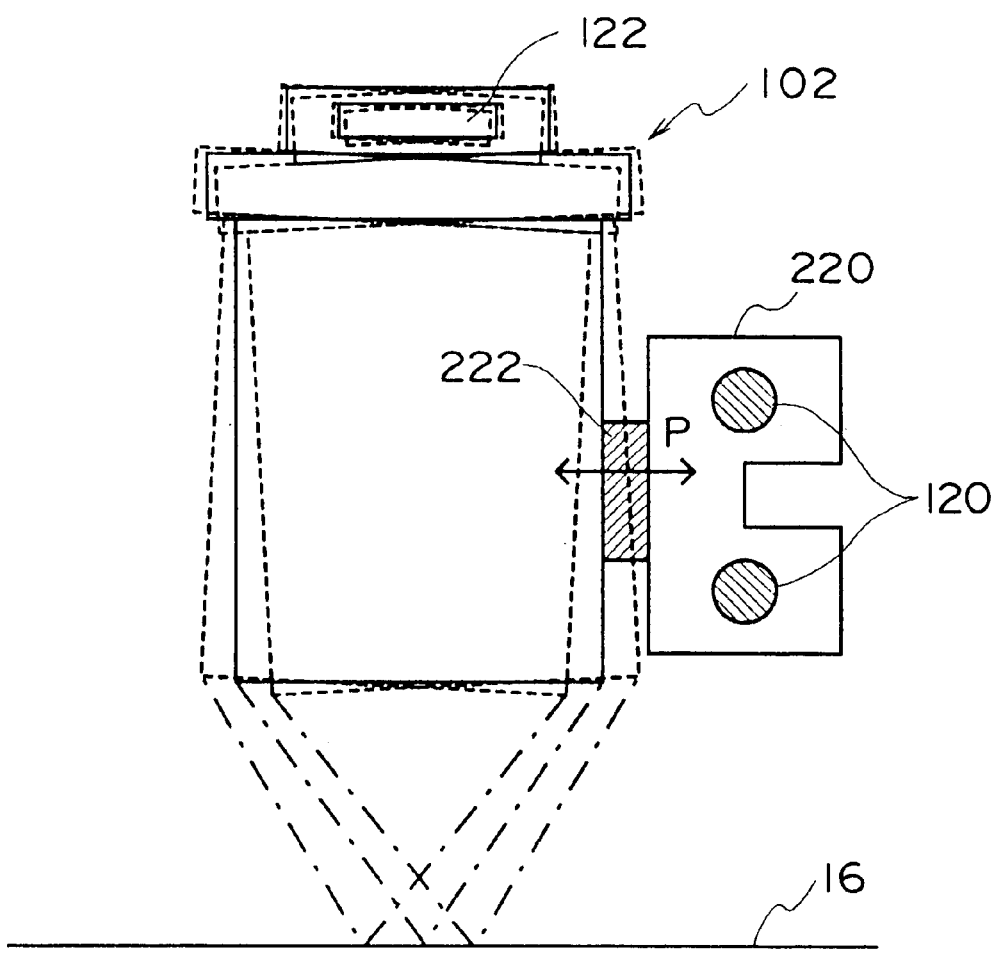
FIGS. 13 through 16 are views showing a structure for adjusting an incident angle of light which is irradiated onto the photosensitive material in the image recording apparatus relating to the first embodiment of the present invention.
Figure 14:
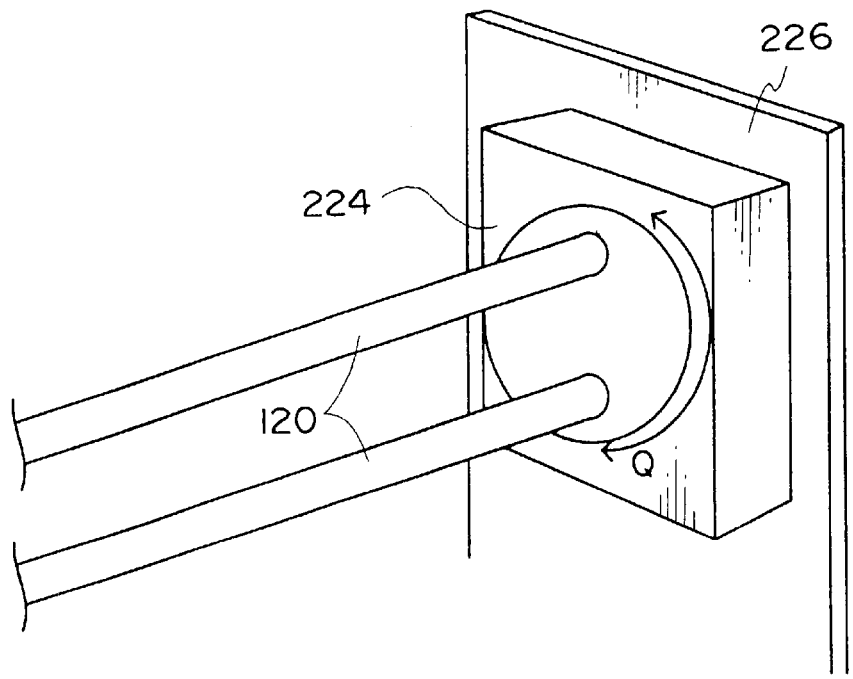
Figure 15:
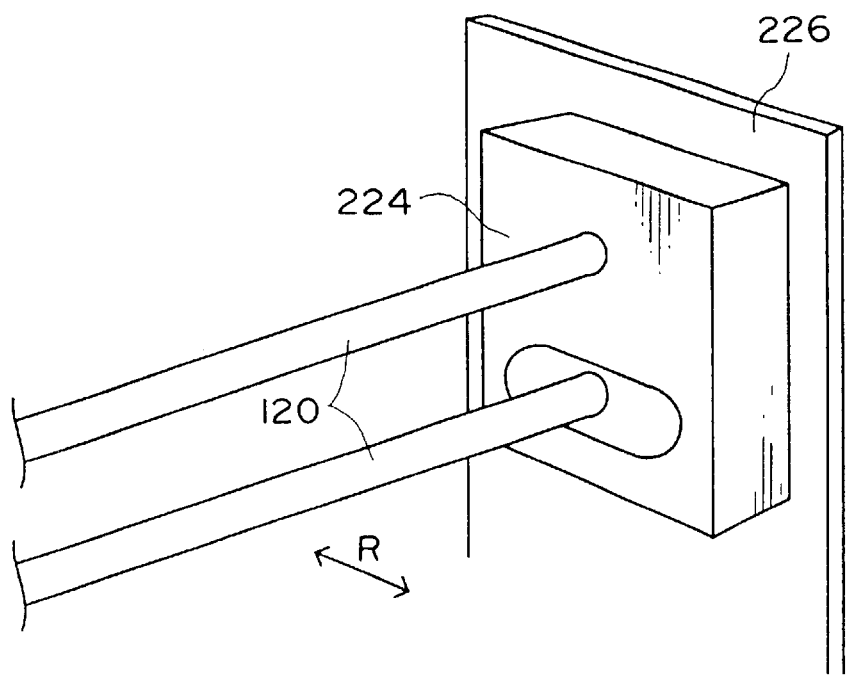

Further, the subscanning direction line pitch error may be corrected by adjusting an incident angle of light which is irradiated onto the photosensitive material 16 from the exposure section 86. The incident angle of light which is irradiated onto the photosensitive material 16 may be adjusted such that, as shown in FIG. 13, for example, the light source unit 102 is fixed via a movement mechanism 222 such as an actuator or the like to a supporting member 220 which is supported by the guide shafts 120, the light source unit 102 is tilted by the movement mechanism 222 in one of either two directions of arrow P (see dotted lines in FIG. 13). Alternatively, as shown in FIG. 14, the guide shafts 120 are supported by a supporting portion 224 and the supporting portion 224 is fixed to a frame 226. Then, the supporting portion 224 may be rotatable in one of either two directions of arrow Q in FIG. 14. Further, as shown in FIG. 15, at least one of the guide shafts 120 may be made to be displaceable in one of either two directions of arrow R in FIG. 15. In any case, on the basis of the feed amount of the photosensitive material 16, the light source unit 102 is appropriately tilted so as to adjust the incident angle of light which is irradiated onto the photosensitive material 16. As a result, the subscanning direction line pitch error can be corrected.

Figure 16:
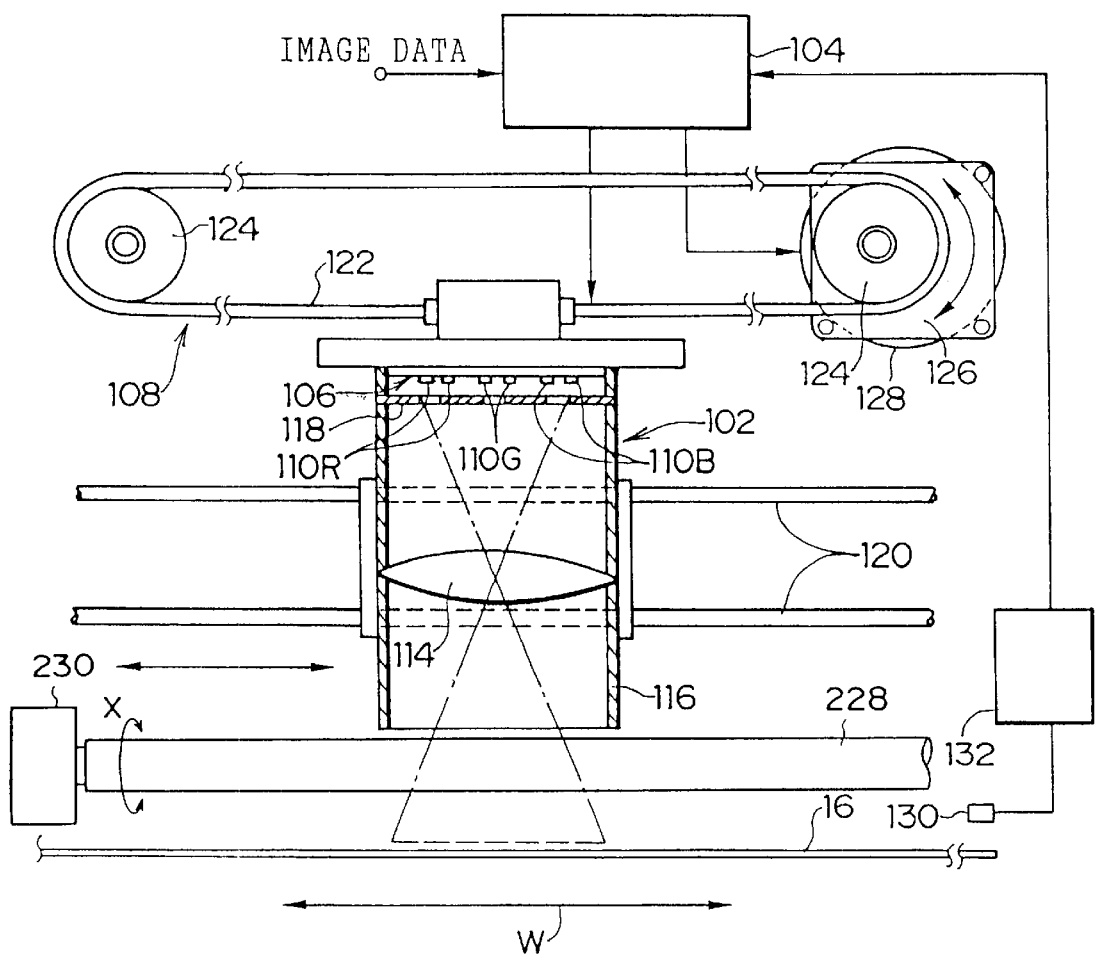
Figure 19:
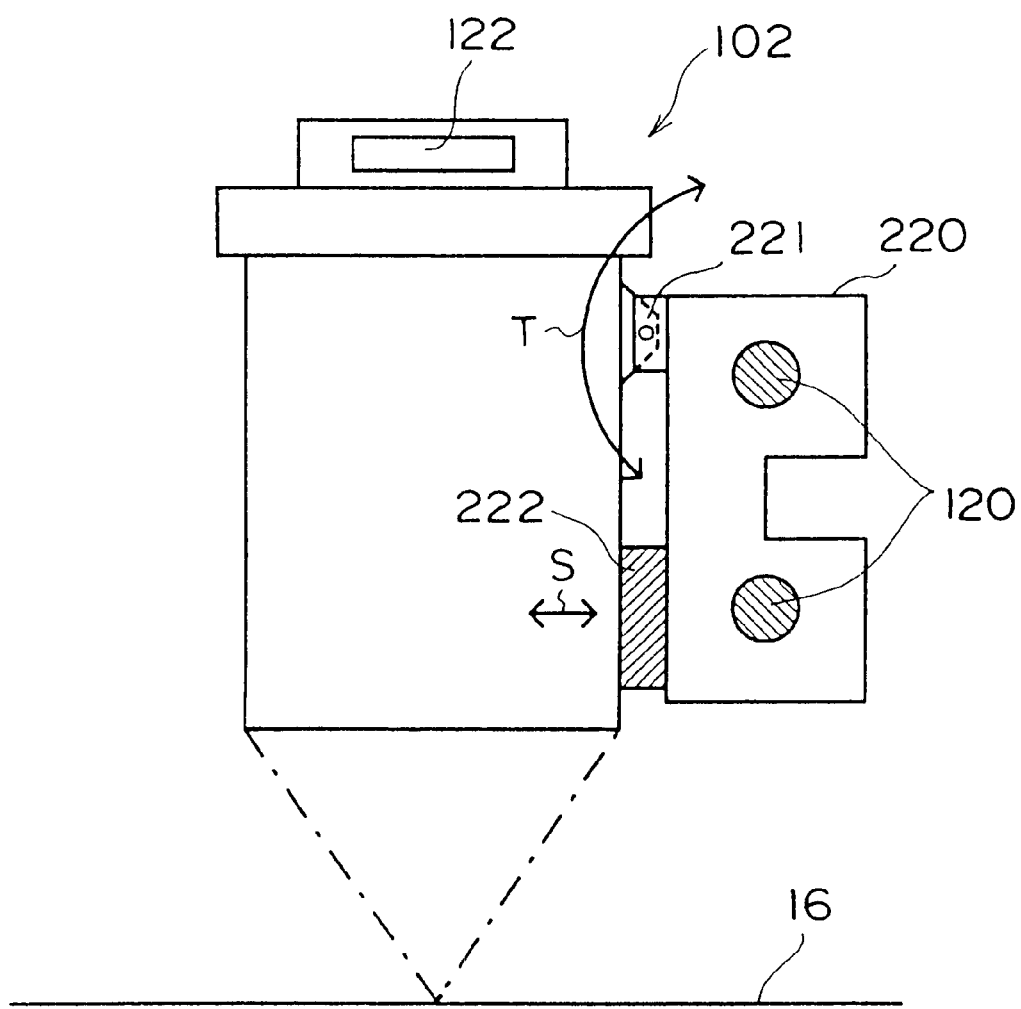
FIG. 19 is a view showing a modified example of a first example of the structure for adjusting the incident of light which is irradiated onto the photosensitive material.

As shown in FIG. 16, the incident angle of light which is irradiated onto the photosensitive material 16 may be adjusted such that a prism 228 and a rotating mechanism 230 such as a motor, an actuator or the like which rotates the prism 228 are provided between the light source unit 102 and the photosensitive material 16, and the prism 228 is rotated in one of either two directions of arrow X. The prism 228 and the rotating mechanism 230 may be provided at the photosensitive material side of the exposure casing 116. The structure for moving the light source unit 102 by the movement mechanism 222 shown in FIG. 13 may also be as follows. As shown in FIG. 19, a hinge 221 is provided at the supporting member 220. One end of the supporting member 220 (the upper end of the supporting member 220 in FIG. 19) is fixed via the hinge 221 to the light source unit 102. The other end thereof (the lower end of the supporting member 220 in FIG. 19) is fixed via the movement mechanism 222 to the light source unit 102. Then, the movement mechanism 222 is moved in one of either two directions of arrow S. In this way, the light source unit 102 can be tilted in one of either two directions of arrow T.

Second Embodiment

Since an image recording apparatus relating to a second embodiment differs from the image recording apparatus 10 relating to the first embodiment only in the structure of the control system connected to the exposure section 86 and the controller 104, structures the same as in the first embodiment are denoted by the same reference numerals, and descriptions thereof will be omitted.

Figure 10A:
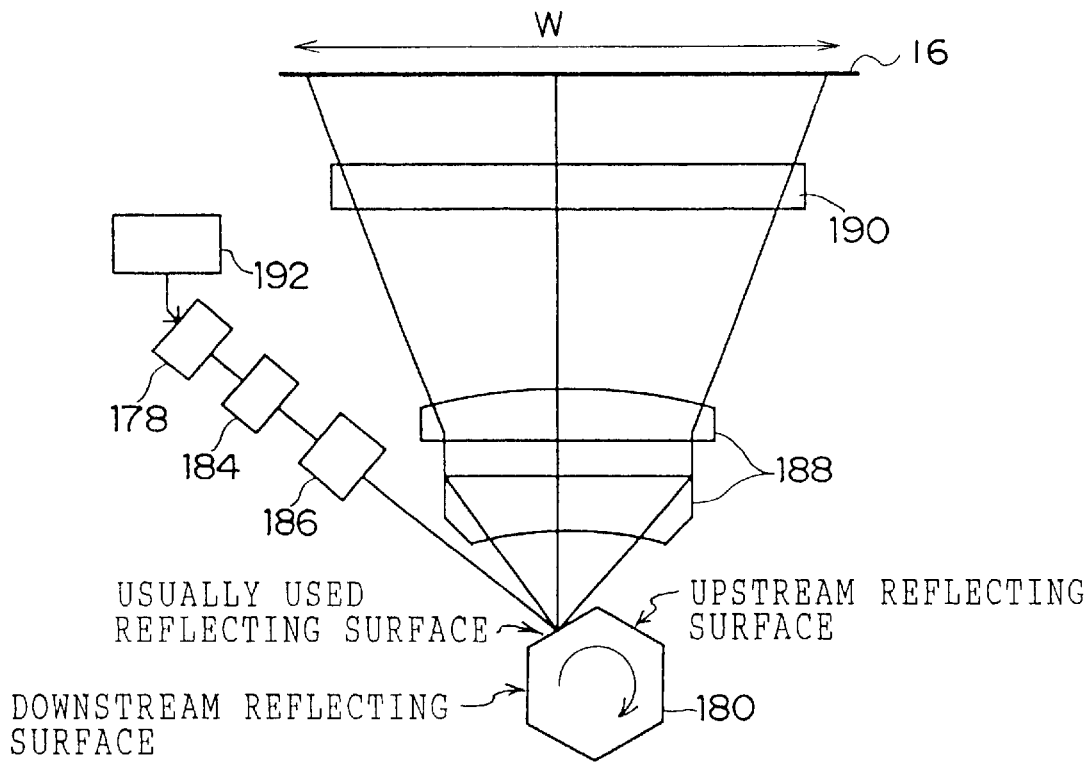
FIG. 10A is a plan view showing a structure of a light scanning device which is an exposure section relating to a second embodiment of the present invention.
Figure 10B:
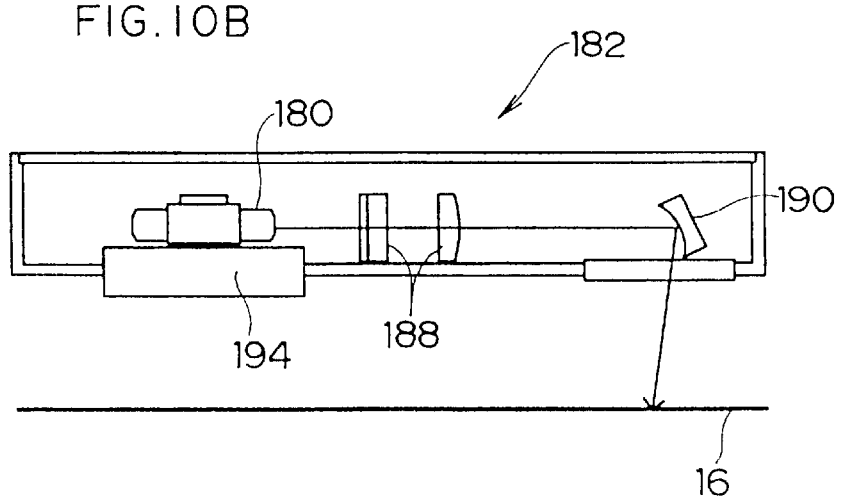
FIG. 10B is a side cross-sectional view of the light scanning device.

FIG. 10A shows a plan view of a light scanning device 182 provided at an exposure section 87 of the second embodiment. FIG. 10B is a side cross-sectional view of the light scanning device 182. In an exposure section 87 of the second embodiment, as shown in FIGS. 10A and 10B, light scanning is carried out in a widthwise direction W of a photosensitive material by the light scanning device 182, which is formed by a laser diode 178 light source, a rotating polygon 180, which has a plurality of reflecting surfaces, and a plurality of lenses.

In the light scanning device 182, the laser diode 178 is driven to emit light by a laser diode driver 192 such that a light beam of diffuse light is emitted. On an optical path of the light beam, a collimator lens 184, a cylindrical lens 186 and the rotating polygon 180 are disposed in that order from near the laser diode 178.

The light beam is converted from diffuse light to a parallel ray by the collimator lens 184, and the converted parallel ray converges onto the reflecting surfaces of the rotating polygon 180 via the cylindrical lens 186. The rotating polygon 180 is rotated by a scanner motor 194 at a high and substantially constant speed. Therefore, an incident angle of the light beam at a respective reflecting surfaces of the rotating polygon 180 is continuously changed and the light beam is deflected.

An f θ lens 188 and a reflecting mirror 190 are disposed in that order from near the rotating polygon 180 along a direction in which the light beam deflected by the rotating polygon 180 proceeds. The f θ lens 188 is formed by two lenses, and is disposed such that a scanning speed when the light beam is scanning the photosensitive material 16 is substantially constant. The light beam transmitted through the f θ lens 188 is reflected by the reflecting mirror 190 so as to be irradiated onto the photosensitive material 16. That is, main scanning with the light beam on the photosensitive material 16 is carried out by rotation of the rotating polygon 180.

In the second embodiment, of the plurality of reflecting surfaces of the rotating polygon 180, only one, predetermined, reflecting surface is used. Light emission control of the laser diode 178 is carried out by the controller 104 such that the light beam is irradiated only on the predetermined one reflecting surface of the plurality of reflecting surfaces.

Figure 11:
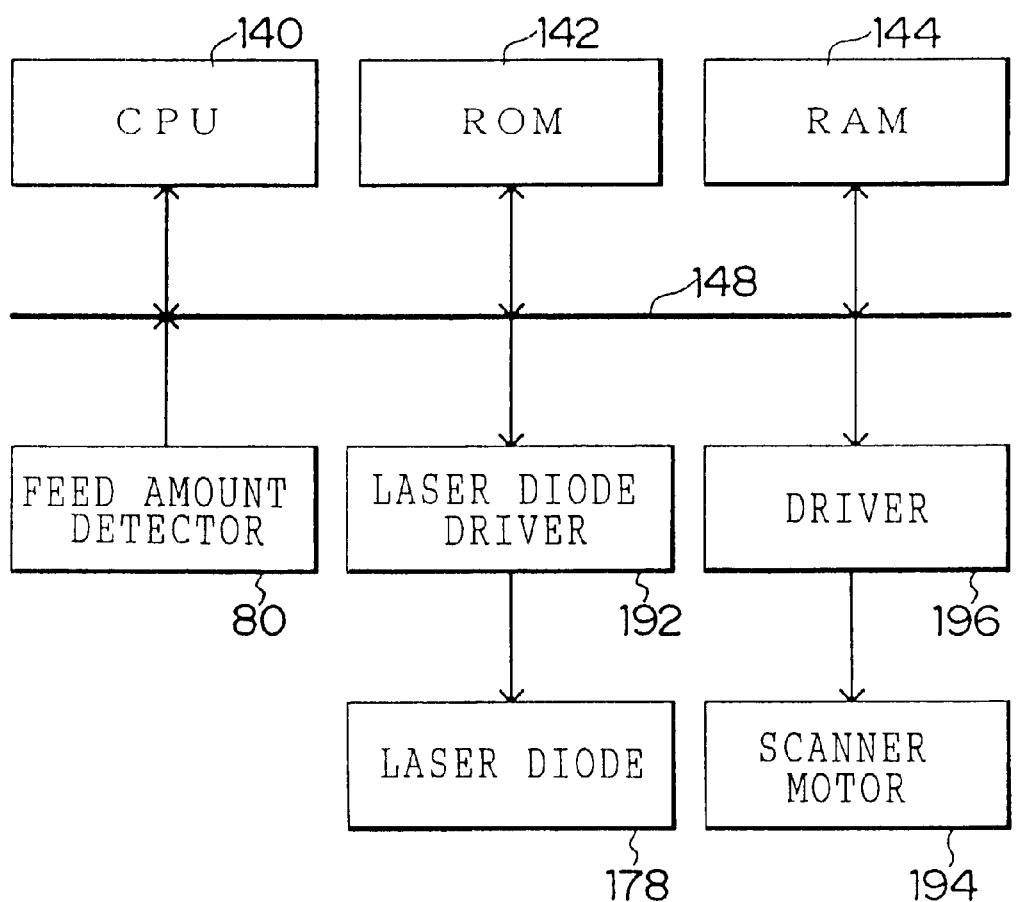
FIG. 11 is a block diagram showing a structure of a control system including a controller relating to the second embodiment of the present invention.

As shown in FIG. 11, the structure of a control system connected to the controller 104 of the second embodiment is formed, as in the first embodiment, by a microcomputer which includes the CPU 140, the ROM 142 and the RAM 144. The CPU 140, the ROM 142 and the RAM 144 are respectively connected to the data bus 148.

Also connected to the data bus 148 are a laser diode driver 192, which drives the laser diode 178, a driver 196, which rotates the rotating polygon 180, and the feed amount detector 80, which detects feed amounts of the photosensitive material 16.

A feed amount of the photosensitive material 16 within a predetermined period of time, which is detected by the feed amount detector 80, is stored in the RAM 144, and is erased after being read out from the RAM 144.

The CPU 140 rotates the scanner motor 194 at a high and substantially constant speed by inputting a predetermined clock signal to the driver 196. Further, the CPU 140 drives the laser diode 178 via the laser diode driver 192 such that the light beam is irradiated onto the predetermined one reflecting surface of the plurality of reflecting surfaces. The CPU 140 also computes an amount of variation of the feed speed of the photosensitive material 16 from the photosensitive material 16 feed amount stored in the RAM 144. Then the CPU 140 controls the laser diode driver 192 on the basis of the amount of variation such that which of the reflecting surfaces the light beam is irradiated onto is shifted.

Figure 6:
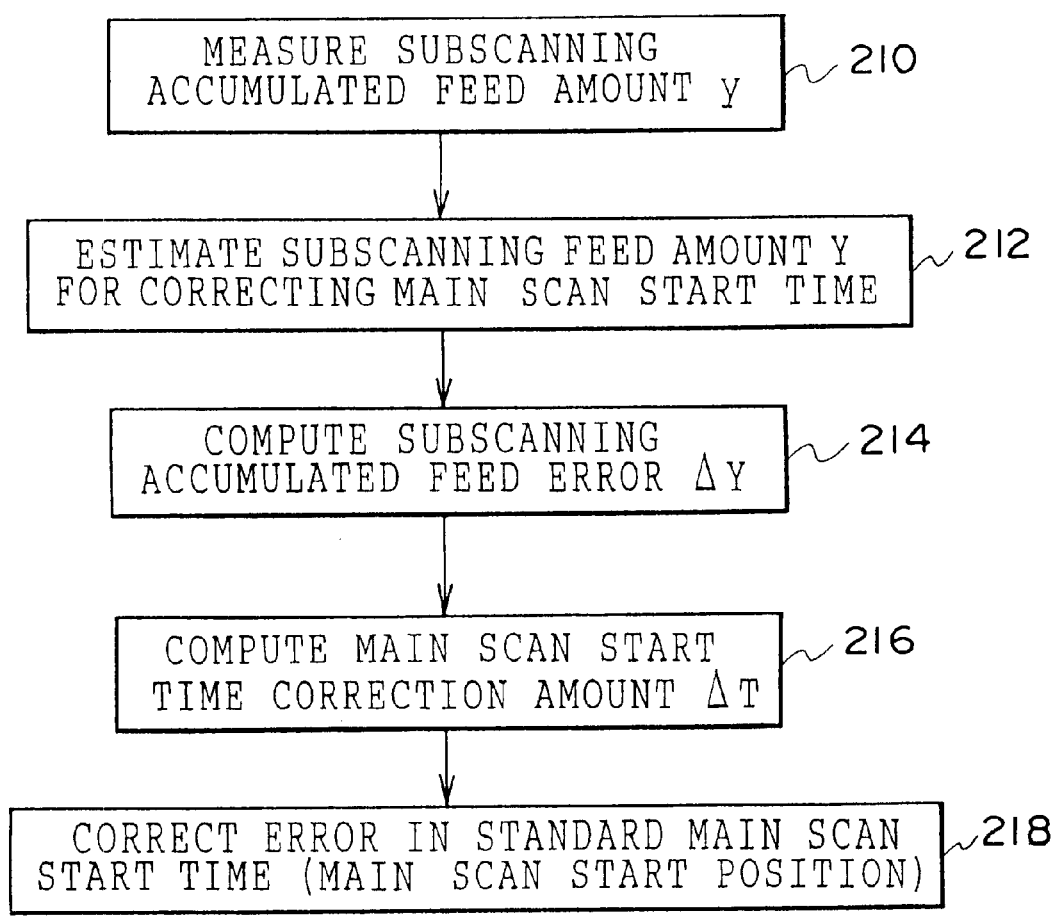
FIG. 6 is a flow chart for explaining a subscanning direction scanning pitch correction method.

In a subscanning direction scanning line pitch correction method of the second embodiment, the main scan start time correction amount ΔT is computed by steps 160 to 168 of FIG. 6 as in the first embodiment. Then, a scanning surface interval correction amount ΔN for the rotating polygon 180 is computed using the following formula (v). The scanning surface interval correction amount ΔN is an amount representing a number of surfaces of a shift with respect to the plurality of reflecting surfaces.

ΔN=ΔT/Scanning Time for One Surface of the Rotating Polygon
(Image Recording Time) (v)

Next, operation of the image recording apparatus with the above-described structure will be explained with reference to a flowchart in FIG. 12.

The tray 54 is loaded into the tray loading opening 56. The supply reel 62 on which the photosensitive material 16 is wound and the empty take-up reel 64 are loaded into their respective predetermined positions. After loading of the photosensitive material 16 is completed, the print start key of the operation/display portion 22 is operated. Then, in step 200, conveyance of the photosensitive material 16 starts.

Next, in step 202, the feed amount of the photosensitive material 16 is detected by the feed amount detector 80. The detection result is stored in the RAM 144 of the controller 104.

In step 204, a variation of the feed amount (a variation of the conveying speed) is computed from the result detected by the feed amount detector 80 by the CPU 140 of the controller 104, and a determination is made as to whether or not the feed amount has changed.

If the determination in step 204 is affirmative, i.e., if it is determined that the feed amount of the photosensitive material 16 has varied, the process proceeds to step 206.

In step 206, a timing for the laser diode 178 to emit light is adjusted in accordance with the variation of the feed amount of the photosensitive material 16 (details thereof will be described later).

Figure 12:
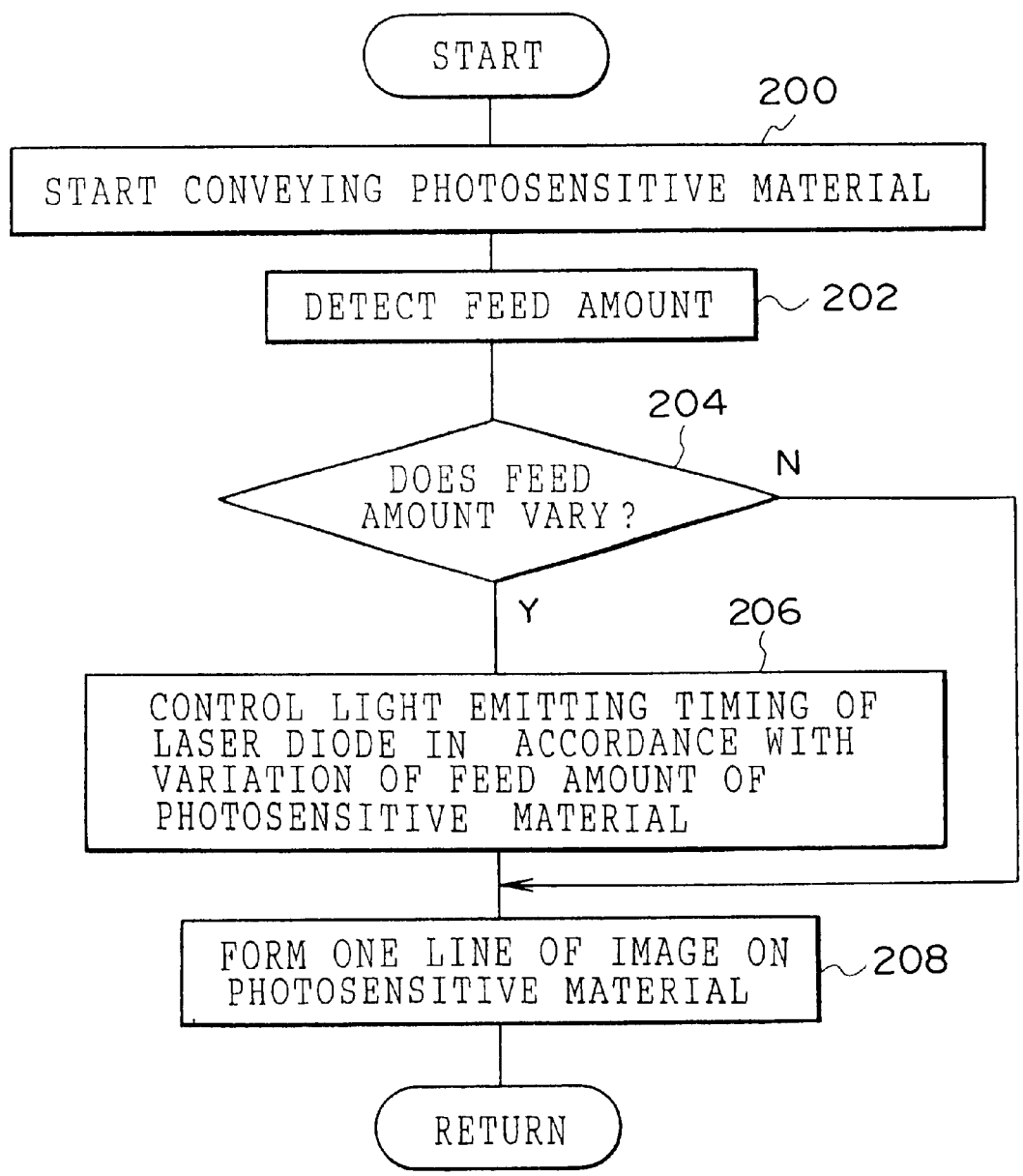
FIG. 12 is a flowchart for explaining operation of an image recording apparatus relating to the second embodiment of the present invention.

In step 208, in accordance with the light emitting timing of the laser diode 178 which timing was adjusted in step 206, one line of an image is recorded on the photosensitive material 16, and the process of FIG. 12 returns to the beginning.

On the other hand, if the determination in step 204 is negative, i.e., if it is determined that there has been no significant variation of the feed amount of the photosensitive material 16 and that the photosensitive material 16 is being conveyed at a substantially constant speed, the process proceeds to step 208. In step 208, one line of the image is recorded onto the photosensitive material 16, and the process of FIG. 12 returns to the beginning.

Next, a description will be given of control of the light emitting timing of the laser diode 178 in step 206.

In general, the rotating speed of the quickly rotating polygon 180 is much faster than the feed speed of the photosensitive material 16. Accordingly, as shown in FIG. 10A, instead of a reflecting surface that is usually used for reflecting the light beam, an adjacent reflecting surface upstream or downstream thereof in the rotation direction can be selected. Thus a subscanning direction scanning line pitch can be adjusted. Although FIG. 10A shows an example in which the reflecting surface is shifted to the upstream or downstream side by one surface, it is possible to increase the scanning line pitch correction amount by shifting the reflecting surface by N surfaces (where N is a natural number).

As shown in FIG. 8, if the feed speed of the photosensitive material 16 is, for example, slower than the target feed speed thereof, the next scanning line will, as in the first embodiment, be at the scanning line 172 which is shown by a dotted line, and the scanning pitch will be narrowed, resulting in image unevenness. The light emitting timing of the laser diode 178 is controlled such that the light beam is irradiated onto a reflecting surface at the rotating direction downstream side of the reflecting surface of the rotating polygon 180 that is currently used. Thus, the scanning line pitch can be corrected so as to be constant.

In contrast, when the feed speed of the photosensitive material 16 is faster than the target feed speed thereof, the next scanning line will be at the scanning line 173, shown by a dotted line, and the scanning pitch will be widened, resulting in image unevenness. The light emitting timing of the laser diode 178 is controlled such that the light beam is irradiated onto a reflecting surface at the rotating direction upstream side of the reflecting surface of the rotating polygon 180 that is currently being used. Thus, the scanning line pitch can be corrected so as to be constant.

In this way, the rotating polygon 180 rotates at a high speed, a reflecting surface of the rotating polygon 180 is selected, and the light beam outputted from the laser diode 178 is adjusted so as to be irradiated onto the selected reflecting surface. Thus, the subscanning direction scanning line pitch can be corrected.

A correction accuracy of the subscanning direction scanning line pitch depends on the number of reflecting surfaces of the rotating polygon 180. The rotating polygon 180 preferably has a large number of reflecting surfaces, because in that case the subscanning direction scanning line pitch can be corrected with higher accuracy.

In the above-described second embodiment, only one surface of the plurality of reflecting surfaces of the rotating polygon 180 is used. However, two or more reflecting surfaces may be used. For example, if two reflecting surfaces are being used, the laser diode 178 can be controlled in accordance with the variation of the feed amount of the photosensitive material 16 such that the light beam is irradiated onto the two reflecting surfaces that are adjacent to the reflecting surfaces being used on respective rotating direction upstream sides or the two of the same that are on respective rotating direction downstream sides. Thus, the subscanning direction scanning line pitch can be corrected.

Figure 17:
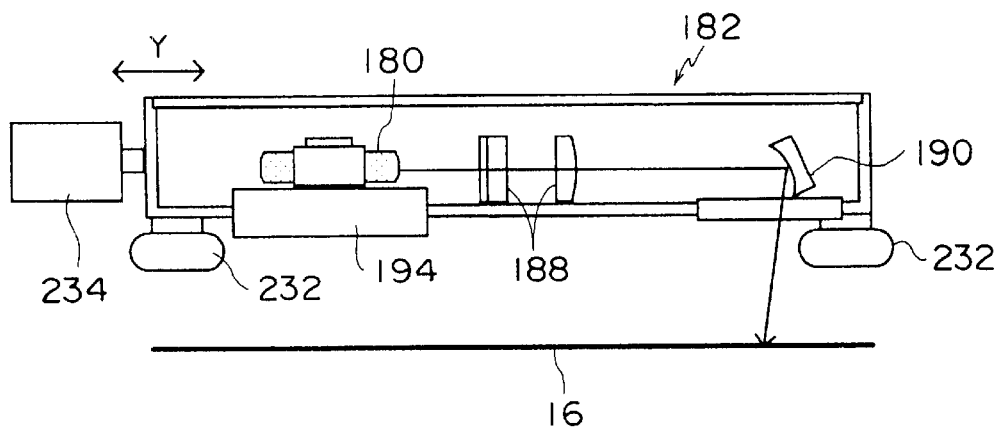
FIG. 17 is a view showing a structure for moving the whole light scanning device in the image recording apparatus relating to the second embodiment of the present invention.
Figure 18A:
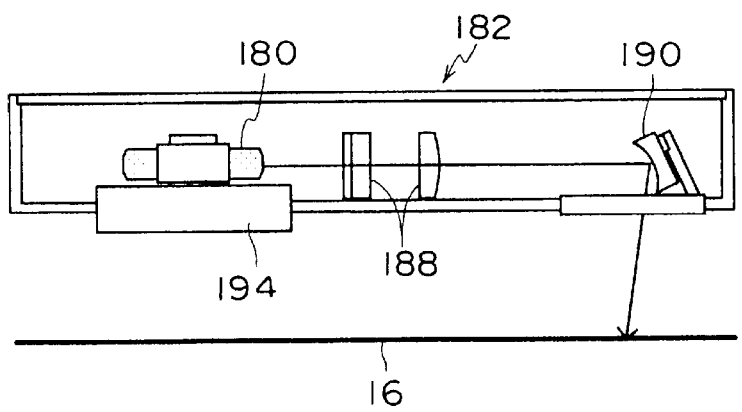
FIG. 18A is a view showing a structure for adjusting a reflecting angle of a reflecting mirror of the light scanning device in the image recording apparatus relating to the second embodiment of the present invention.
Figure 18B:
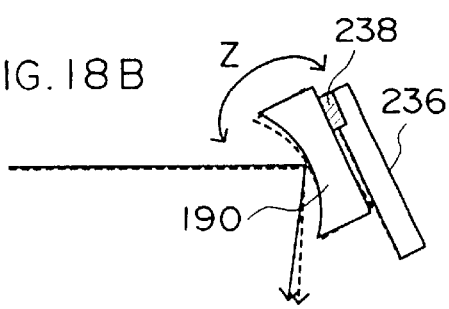
FIG. 18B is an enlarged view of the mechanism for adjusting the reflecting angle of the reflecting mirror shown in FIG. 18A.

In the above-described second embodiment, the subscanning direction line pitch is corrected by selecting a reflecting surface of the rotating polygon 180, but the present invention is not limited to this case. The line pitch can be corrected by moving the whole light scanning device 182 along the subscanning direction. For example, as shown in FIG. 17, the light scanning device 182 is fixed so as to be displaceable using dampers 232 formed by a resilient material such as a rubber or the like. A displacement mechanism 234 such as an actuator or the like which presses an outer frame of the light scanning device 182 is provided and moves in one of either two directions of arrow Y in FIG. 17. The subscanning direction line pitch can be corrected by adjusting an amount of displacement of the light scanning device 182 on the basis of a variation amount of the feed of the photosensitive material 16. Further, as shown in FIGS. 18A and 18B, the incident angle of light beam to the photosensitive material 16 is adjusted by adjusting a reflecting angle of a reflecting mirror 190 of the light scanning device 182. In this way, the subscanning direction line pitch can be corrected. As shown in FIG. 18B, a bracket 236 which rotatably supports the reflecting mirror 190 is provided. Further, a piezoelectric element 238 which rotates the reflecting mirror 190 is provided between the bracket 236 and the reflecting mirror 190. The piezoelectric element 238 is controlled so as to rotate the reflecting mirror 190 in one of either two directions of arrow Z in FIG. 18 and to adjust the incident angle of light beam to the photosensitive material 16. As a result, the subscanning direction line pitch can be corrected. In order to adjust the reflecting angle of the reflecting mirror 190, an actuator, a solenoid or the like may be used in addition to the piezoelectric element 238.

Further, although a description has been given of an image recording apparatus which exposes a photosensitive material by light scanning, the present invention is not limited to the same. For example, the present invention can also be applied to an image recording apparatus which includes a scanning head that ejects ink, or the like. In this case, a movement speed of the scanning head may be controlled before image recording starts. The timing for starting image recording or the position of the scanning head may be controlled.

As explained above, in the present invention, a subscanning direction scanning line pitch is corrected not by controlling conveyance of a photosensitive material but by controlling parameters of main scanning such as a main scan start time and the like. Therefore, it is not necessary to further enhance the accuracy of components of a mechanism for conveying the photosensitive material, and an apparatus can be inexpensive.

What is claimed is:

1. An image recording apparatus comprising:
   a scanner which records an image by scanning lines formed by scanning on a recording medium in a predetermined scanning direction;
   a detector which detects an amount of feed of said recording medium which is fed in a direction substantially perpendicular to the scanning direction of said scanner; and
   a controller which controls an image recording position of said scanner in a direction of feeding said recording medium on the basis of a feed error computed from said feed amount detected by said detector.

2. The image recording apparatus of claim 1, wherein said scanner has a light emitting portion and reciprocally moves on said recording medium along said scanning direction while making the light emitting portion emit light.

3. The image recording apparatus of claim 2, wherein in a scan of a scanning line to be corrected, the controller adjusts a stop time at at least one of a start point and an end point of movement of the scanner.

4. The image recording apparatus of claim 2, wherein in a scan of a scanning line to be corrected, the controller adjusts at least one position of a start point and an end point of movement of said scanner.

5. The image recording apparatus of claim 2, wherein in a scan of a scanning line to be corrected, the controller adjusts a movement speed of said scanner when said recording medium moves on non-image areas.

6. The image recording apparatus of claim 2, wherein in a scan of a scanning line to be corrected, the controller adjusts a timing for starting emitting light of the light emitting portion of said scanner.

7. The image recording apparatus of claim 1, wherein said scanner comprising:
a light emitting portion; and
a rotating polygon which has a plurality of surfaces which can reflect a light beam from the light emitting portion;
wherein a position, at which a light beam which is reflected by at least one surface which is selected in advance among said plurality of surfaces is irradiated onto said recording medium, is moved in said scanning direction by rotating said rotating polygon.

8. The image recording apparatus of claim 7, wherein the controller adjusts the timing for emitting light of said light emitting portion such that a surface by which a light beam is reflected is shifted from said at least one surface which is selected in advance to a surface which is not selected among said plurality of surfaces.

9. The image recording apparatus of claim 7, wherein said scanner is displaced along a direction of feeding said recording medium.

10. The image recording apparatus of claim 1, wherein said detector detects the feed amount within a predetermined period of time prior to a start of scanning by said scanner.

11. An image recording apparatus comprising:
a scanner which has a light emitting portion and records an image by scanning on a recording medium with a light beam emitted from the light emitting portion in a predetermined scanning direction;
a detector which detects a feed amount of said recording medium fed in a direction substantially perpendicular to the scanning direction of said scanner; and
a controller which, on the basis of a feed error computed from said feed amount detected by said detector, controls an incident angle with respect to said recording medium when a light beam of said scanner irradiates said recording medium.

12. The image recording apparatus of claim 11, wherein said scanner reciprocally moves on said recording medium along a guide member provided so as to be parallel to said scanning direction.

13. The image recording apparatus of claim 12, further comprising a mechanism for tilting said scanner in a direction of feeding said recording medium.

14. The image recording apparatus of claim 13, wherein the mechanism displaces the guide member in the direction of feeding said recording medium.

15. The image recording apparatus of claim 13, wherein said mechanism rotates the guide member about an axis parallel to the scanning direction of said scanner.

16. The image recording apparatus of claim 12, further comprising a prism and a rotating mechanism for rotating the prism between said scanner and said recording medium.

17. The image recording apparatus of claim 11, wherein said scanner comprising:
a light emitting portion; and
a rotating polygon which has a plurality of surfaces which can reflect a light beam from the light emitting portion;
a mirror which reflects a light beam reflected from a surface of the rotating polygon so as to be irradiated onto said recording medium; and
a mechanism for adjusting an angle of the mirror.

18. The image recording apparatus of claim 11, wherein said detector detects the feed amount within a predetermined period of time prior to a start of scanning by said scanner.

19. An image recording method which records an image by scanning a recording medium which is fed in a direction substantially perpendicular to a scanning direction of a scanner comprising the steps of:
detecting a feed amount of the recording medium;
computing a feed error from said feed amount; and
correcting an image recording start time of the scanner on the basis of said feed error.

20. The image recording method of claim 19, further comprising a step of storing and reading the detected feed amount.

21. The image recording apparatus of claim 11, wherein the controller controls the incident angle with respect to the feeding direction of said recording medium.

22. The image recording method of claim 19, wherein, in the correcting step, an image recording position of said scanner in a feeding direction of said recording medium is corrected.

* * * * *